United States Patent [19]

van Driest et al.

[11] Patent Number: 5,049,766
[45] Date of Patent: Sep. 17, 1991

[54] DELAY MEASURING CIRCUIT

[75] Inventors: Hans van Driest, Bilthoven; Hendrik van Bokhorst, Nijkerk; Richard Kruithof, Voorschoten, all of Netherlands

[73] Assignee: NCR Corporation, Dayton, Ohio

[21] Appl. No.: 493,593

[22] Filed: Mar. 15, 1990

[30] Foreign Application Priority Data

Oct. 27, 1989 [GB] United Kingdom ............... 8924203

[51] Int. Cl.$^5$ ...................... H03K 5/14; H03K 5/153
[52] U.S. Cl. .............................. 307/603; 307/518; 328/55; 328/133; 377/20; 377/56
[58] Field of Search ............ 307/602, 603, 517, 518, 307/265, 269; 328/55, 133; 377/20, 56

[56] References Cited

U.S. PATENT DOCUMENTS

| | | | |
|---|---|---|---|
| 4,330,751 | 5/1982 | Swain | 307/265 |
| 4,623,805 | 11/1986 | Flora et al. | 307/602 |
| 4,637,018 | 1/1987 | Flora et al. | 328/55 |
| 4,754,164 | 6/1988 | Flora et al. | 307/602 |
| 4,755,704 | 7/1988 | Flora et al. | 307/602 |
| 4,777,385 | 10/1988 | Hartmeier | 307/517 |
| 4,968,907 | 11/1990 | Pepper | 307/603 |
| 4,979,194 | 12/1990 | Kawano | 307/265 |

Primary Examiner—John S. Heyman
Attorney, Agent, or Firm—Wilbert Hawk, Jr.; Stephen F. Jewett; Albert L. Sessler, Jr.

[57] ABSTRACT

In a delay measuring circuit (10), an input clock signal (13) is applied to a multitapped delay line (14), the output taps of which are connected to a switch (26) which selects one of the switch inputs for connection to a phase comparator (34) which compares the input clock signal (13), delayed in a delay device (38) to compensate for the delay inherent in the switch (26), with the output of the switch (26). The input clock signal is also applied to a counter (22), and when the phase comparator (34) detects a phase match, the counter value is stored in a latch (32), the counter (22) is reset to a predetermined value, and the counting procedure resumed. The latch (32) thus always stores a value dependent on the delay of an individual delay cell (16-1 to 16-N). This stored value can be applied to various uses, such as in a timing watchdog circuit or for generating accurate delays.

9 Claims, 3 Drawing Sheets

DELAY MEASURING CIRCUIT

CROSS REFERENCE TO RELATED APPLICATION

Digital Phase Locked Loop Decoder, U.S. Pat. No. 5,003,562, issued Mar. 26, 1991, inventors H. van Driest, H. van Bokhorst and R. Kruithof.

BACKGROUND OF THE INVENTION

This invention relates to delay measuring circuits.

The invention has a particular application to integrated circuits wherein a large number of individual cells are implemented on a single chip, the chip circuitry including such cells in the circuit implemented on the chip. Production process variation and temperature and power voltage supply fluctuations are the same for every cell on one chip. Thus, all these cells have the same characteristics, such as switching levels and propagation delay, the relative delay between individual cells being minimal. However, production process variations and temperature and power supply voltage fluctuations can cause a large absolute delay difference between two integrated circuit chips. Thus, circuit designs needing accurate absolute delays cannot generally be implemented on integrated circuit chips.

U.S. Pat. No. 4,623,805 discloses a clock signal distribution system employing a plurality of clock distribution chips responsive to a main clock signal. The system provides for the clock signal generated by each chip to be automatically adjusted to be delayed by an amount corresponding to the delay provided by an accurate fixed delay external to the chip, such as a fixed length of wire. Thus the clock signals provided by all the clock distribution chips are synchronized with one another. For this purpose, each chip includes a multitapped delay line, a phase comparator, a multiplexer having inputs connected to the delay line taps, and a counter. The phase comparator compares the phase of the output of the external fixed delay with the clock signal generated by the chip, the arrangement being such that the counter controls the multiplexer to select an appropriate tap signal output to provide a clock signal delay corresponding to the fixed, external delay.

SUMMARY OF THE INVENTION

According to the present invention, there is provided a delay measuring circuit, characterized by input means adapted to receive an applied clock signal, and coupled to a delay line having a plurality of individual delay cells, with outputs thereof respectively connected to inputs of a switching device, said input means being further connected to an input of counter means and to a delay device having a delay substantially equal to the intrinsic delay of said switching device, wherein said counter means has output means coupled to latch means and to a plurality of control inputs of said switching device to thereby connect a selected input of said switching device to an output thereof, and wherein phase comparator means are provided having inputs coupled to said output of said switching device and to an output of said delay device, an output of said phase comparator means being coupled to said counter means and to said latch means, whereby in response to a phase comparison match, the count value in said counter means is latched into said latch means and said counter means is reset to a predetermined value, such that said latch means stores a value dependent on the delay of one of said individual delay cells.

A delay measuring circuit according to the invention finds application in a plurality of environments. Two exemplary applications will be described hereinafter. A first application is in a timing watchdog circuit, wherein an alarm signal is generated when the timing of an integrated circuit falls below a predetermined safety level. A second application permits the generation of signals having a delay equal to a predetermined fraction of a reference clock signal.

It is accordingly an object of the present invention to provide a delay measuring circuit which can be employed to improve the utilization of integrated circuit chips.

BRIEF DESCRIPTION OF THE DRAWINGS

Embodiments of the invention will now be described by way of example, with reference to the accompanying drawings, in which.

DETAILED DESCRIPTION

Figure 1:
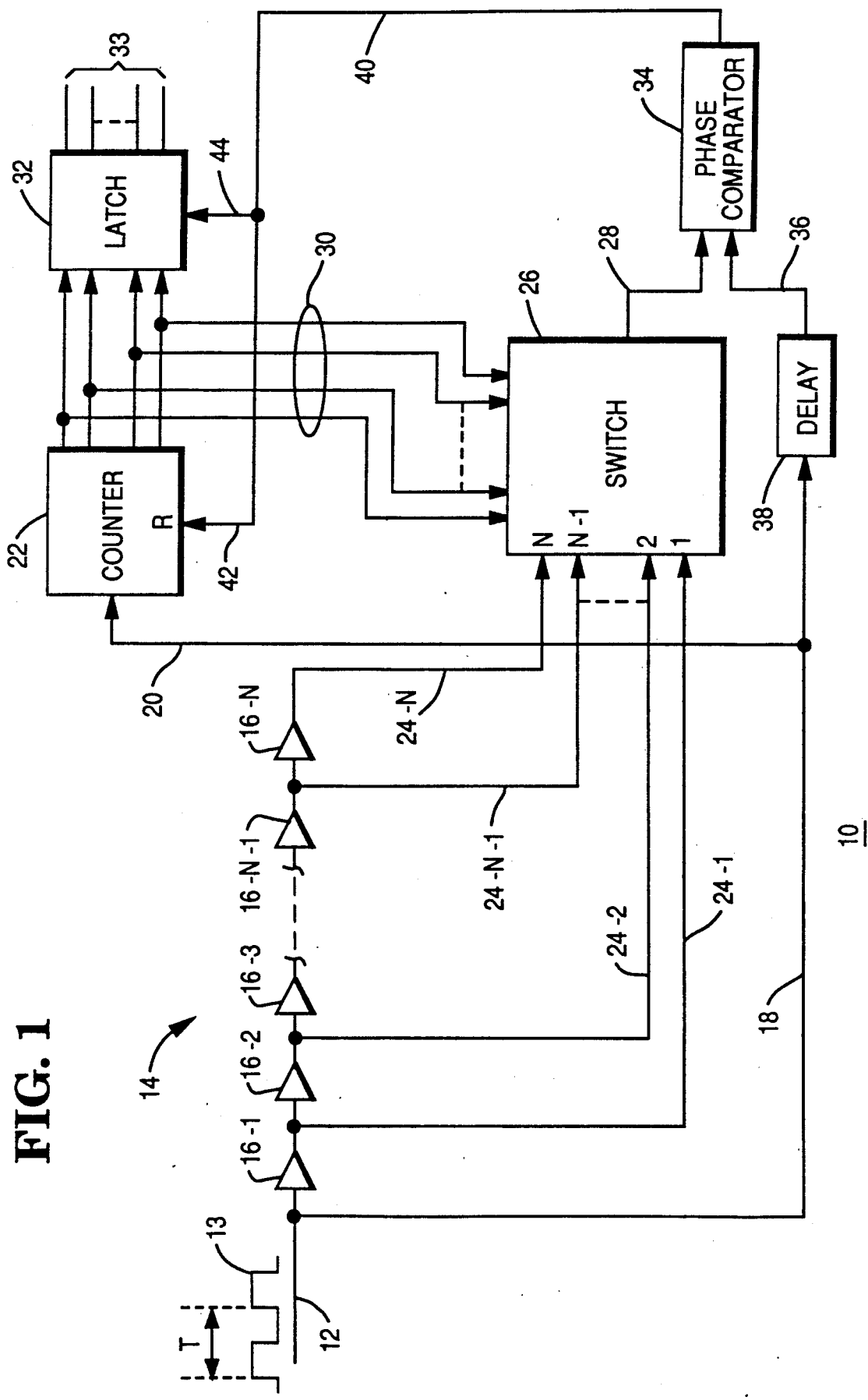
FIG. 1 is a block diagram of a delay measuring circuit according to the invention.

Referring first to FIG. 1, there is shown an embodiment of a delay measuring circuit 10 according to the invention. The circuit 10 includes an input line 12 to which is applied in operation a reference clock signal 13 having a fixed period T. The input line 12 is connected to the input of a delay line 14 which includes a plurality N of identical, series-connected delay cells 16, identified respectively as 16-1 to 16-N, each having a delay time of D. The construction of such delay cells is well known. For example, each delay cell could be implemented as a buffer cell or alternatively as an AND gate, and formed by field effect transistors in an integrated circuit, such as a CMOS circuit.

The input line 12 is connected via lines 18, 20 to a counter 22. The outputs of the delay cells 16-1 to 16-N are connected via respective lines 24-1 to 24-N to N inputs of a switch 26 having a single output connected to an output line 28.

The counter 22 is an A-bit binary counter having A outputs, connected via A lines 30 to respective control inputs of the switch 26. It should be understood that the operation of the switch 26 is such that a selected one of the N inputs thereof is connected to the output line 28, in dependence on the signals applied over the lines 30 to the A control inputs of the switch 26.

The output lines of the counter 22 are also connected to the inputs of a latch circuit 32 having A output lines 33. The output line 28 of the switch 26 is connected to a first input of a phase comparator circuit 34 having a second input which is coupled over a line 36 to the output of a delay circuit 38, the input of which is coupled to the line 18 and hence receives the applied clock signal 13. The delay circuit 38 is constructed to provide a delay d which is equal to the intrinsic delay d of the switch 26, that is, the delay d which results to signals passing from any one of the N inputs of the switch 26 to the output thereof. The output of the phase comparator 34 is connected via a line 40 to a reset input 42 of the counter 22, whereby the counter is reset to a predetermined count value of S. The value of S may be hardwired or loaded into the counter stages by logic incorporated in the counter 22. The output of the phase comparator 34 is also connected via the line 40 to a control input 44 of the latch 32 whereby the value present on the lines 30 may be stored in the latch 32.

The circuit 10 measures the number of delay cells 16 which provide a cumulative delay equal to one period T of the reference clock signal 13. This operation will now be explained. It is assumed that the counter 22 is initially at the predetermined value S. With this value S in the counter 22, the switch 26 is effective to connect its input number S to the output line 28, that is, the output of delay cell number S is connected to the switch output line 28. Consequently, the output line 28 of the switch 26 will carry a signal which corresponds to the reference clock 13 delayed by the delay of S delay cells, that is, a delay of D·S, plus the intrinsic delay d of the switch 26.

If the two inputs to the phase comparator 34 do not match in phase, the count value on the counter 22 is incremented to the value S+1 on the next positive-going reference clock transition, and a further phase comparison is effected in the phase comparator 34. These steps are repeated until the phases of the input signals on the input lines 28, 36 to the phase comparator 34 match. The count in the counter 22 has the value X at this time. This implies that the reference clock 13, delayed with X times the delay of one delay cell, that is, delayed by a time, and the (undelayed) reference clock 13, have the same phase. In this situation, the delay value X·D equals the reference clock period T, that is:

$$T = X \cdot D$$

This value X is stored in the latch 32 in response to a match output signal on the output line 40 of the phase comparator 34, applied over the latch control input 44.

It will now be appreciated that by providing the delay circuit 38 having a delay equal to the delay d, the intrinsic delay d of the switch 26 is compensated. It will be seen that, with the switch in position S, the output signal on the line 28 is the reference clock signal 13 delayed by D·S+2. Since the phase comparator 34 compares the phase of the output signal of the switch 26 on the line 28 with the output signal of the delay circuit 38 on the line 36, it will be appreciated that the delay circuit 38 compensates for the delay inherent in the switch 26.

After the value X has been stored in the latch circuit 32 the counter 22 is reset to the value S again and the incrementing of the counter 22 and phase comparison in the phase comparator 34 take place as described above.

In an application where the delay measuring circuit 10 is implemented in an integrated circuit chip, such as a VLSI (very large scale integrated) chip, the period of the reference clock signal is arranged to be of a sufficiently small value such that the described counting and phase comparison are effected at such a speed that the repeated storing of the value X in the latch circuit 32 takes place at a speed which exceeds any temperature and power voltage fluctuations in the integrated circuit chip by an order of magnitude. Thus, the value of X stored in the latch circuit 32 is always related to the delay D of a delay cell 16 by the expression X=T/D. Since the value of T is known and fixed, the actual delay of a signal delay cell 16 can be readily calculated with the aid of a divider unit or by a processor, if desired, using the value stored in the latch circuit 32 and available on the latch output lines 33, from the formula D=T/X.

The delay measuring circuit 10, when implemented on an integrated circuit chip, thus continuously measures the number of delay cells 16 having a cumulative delay equal to one period T of the reference clock signal 13. Since production process variations and temperature and power supply voltage variations are substantially the same for all cells on such a chip, all cells on the chip will have substantially the same characteristics (such as switching levels and propagation delay), with minimal variation between individual cells. However, production process variations and temperature and power supply voltage variations can cause a large absolute delay difference between two individual chips. The described delay measuring circuit provides a measure dependent on the absolute value of the delay of a delay cell. The delay measuring circuit 10 can be utilized in various applications, two of which will now be described in detail with reference to FIG. 2 and FIG. 3, respectively.

Figure 2:
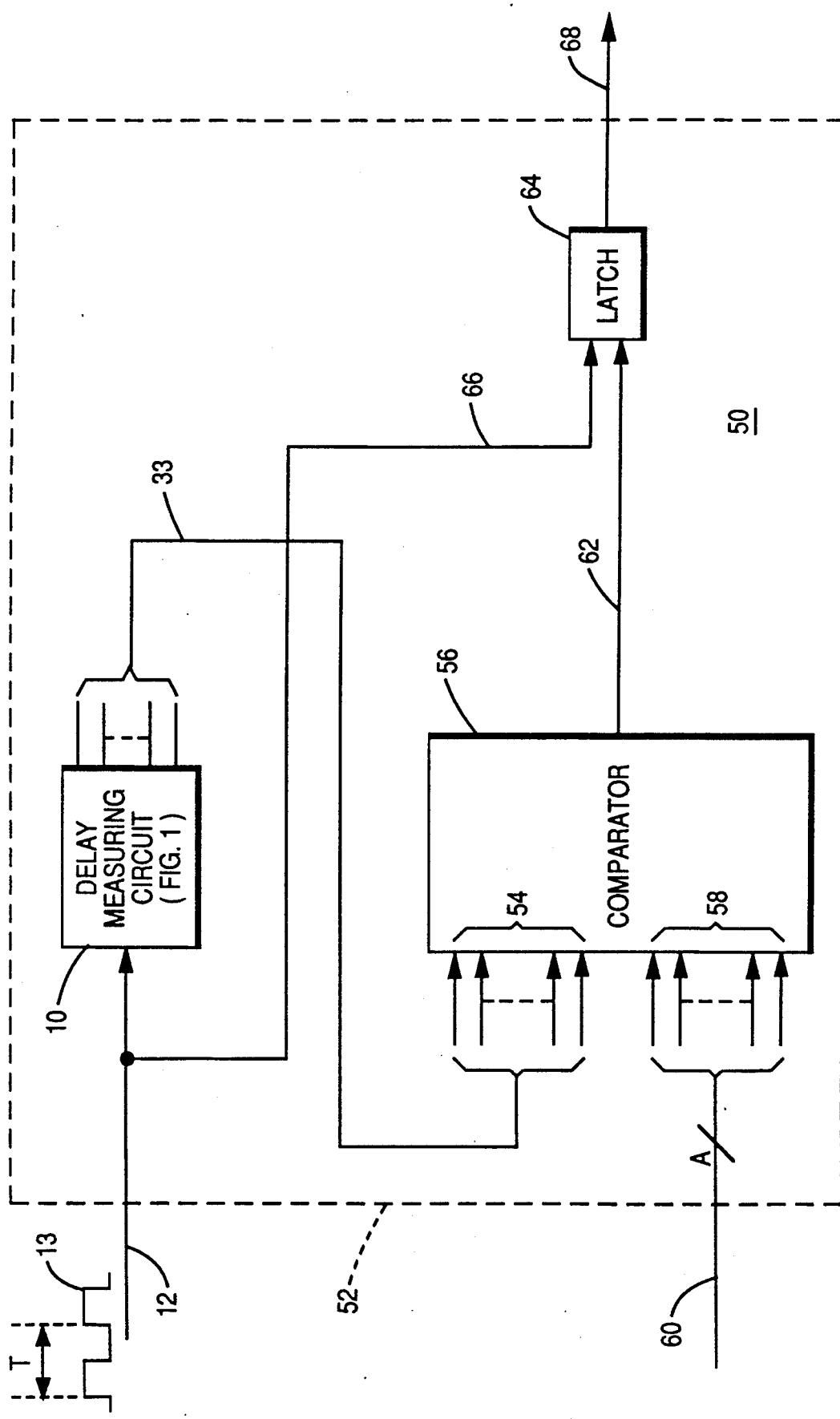
FIG. 2 is a block diagram of a timing watchdog circuit utilizing the delay measuring circuit shown in FIG. 1.

Referring now to FIG. 2, there is shown a second embodiment of the invention, implementing an application of the delay measuring circuit 10 to provide a timing watchdog or monitoring circuit 50 in an integrated circuit chip/ such as VLSI chip 52 containing various circuitry (not shown). The timing watchdog circuit of FIG. 2 provides an error flag alarm signal which enables corrective action to be taken should the timing of the VLSI chip become too slow.

The timing watchdog circuit 50 includes the delay measuring circuit 10, described hereinabove with reference to FIG. 1. The output lines 33 of the latch circuit 32 (FIG. 1) are connected to a first set of inputs 54 of a comparator circuit 56, which has a second set of inputs 58 to which are applied signals from an A-bit bus 60, representing a maximum value M. Should the value of X, on the lines 33, exceed the value M, the comparator 56 provides an output signal on a line 62 which is clocked into a latch circuit 64 by the next positive-going clock signal transition on the line 12, applied via a connecting line 66 to the clock input of the latch circuit 64. The latch circuit 64 now provides an error flag alarm signal over an output line 68.

The timing watchdog circuit 50 may be used in high reliability environments where it is essential that the circuitry (not shown) in the VLSI chip 52 always meets a worst case timing requirement. Degradation of the chip 52 itself or excessive variation in temperature or supply voltage could result in the chip 52 no longer meeting the required worse case timing. The value M applied over the bus 60 is selected such that an error flag alarm signal is provided on the line 68 before substantial timing problems occur.

Figure 3:
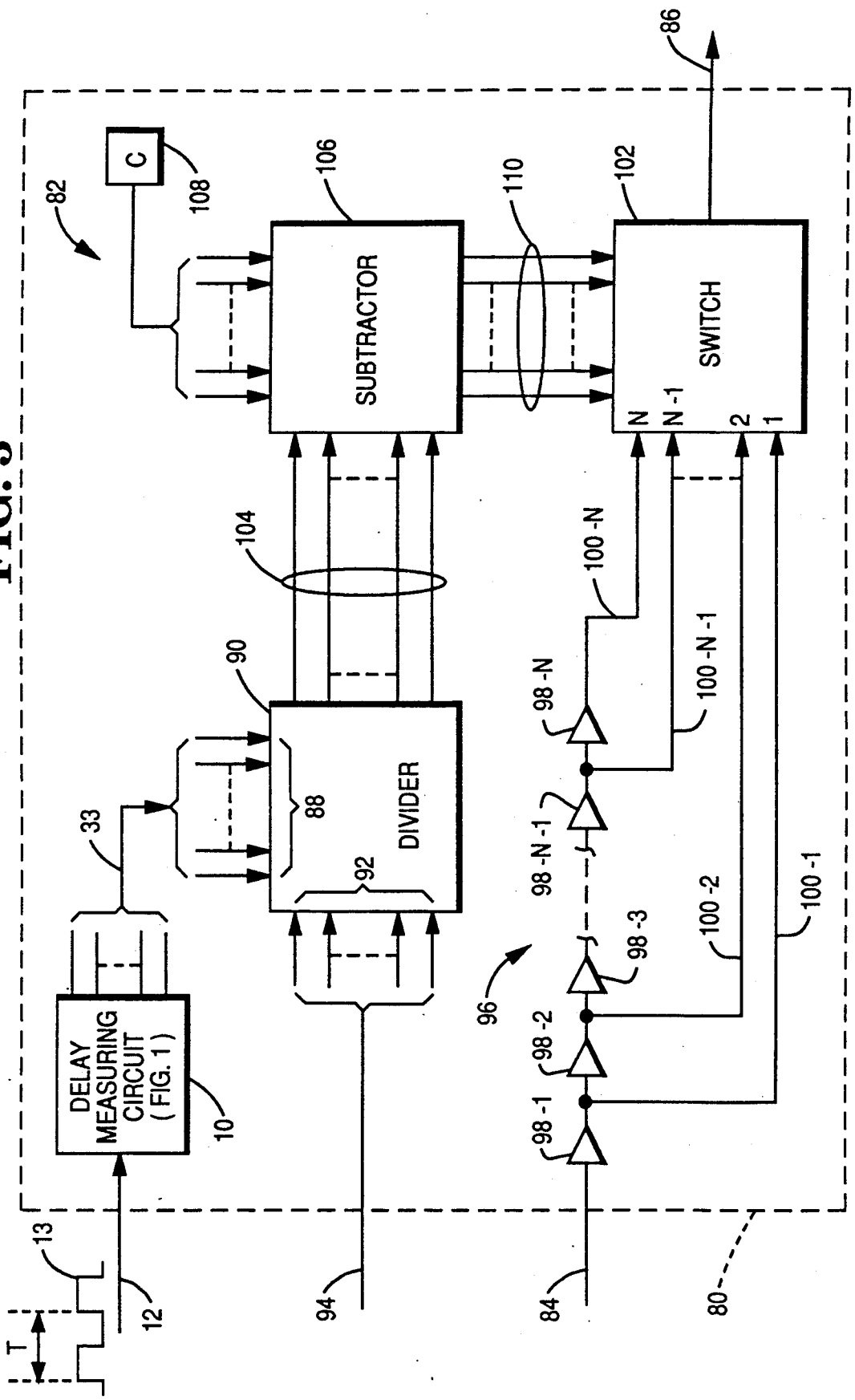
FIG. 3 is a block diagram of a delay generating circuit utilizing the delay measuring circuit shown in FIG. 1.

Referring now to FIG. 3, there is shown a third embodiment of the invention, implementing an application of the delay measuring circuit 10 to provide a programmable delay such that a reference clock signal 13 can be delayed by a predetermined fraction of the reference clock period. An integrated circuit chip 80 is shown in FIG. 3 as including a circuit 82 which generates a delay equal to a desired fraction of the reference clock period, such fraction being maintained despite temperature and power supply voltage fluctuations. Thus, an input signal on a line 84 is delayed by a predetermined fraction F of the period T of the reference clock signal 13.

The integrated circuit chip 80 includes the delay measuring circuit 10, described hereinabove with reference to FIG. 1. The output lines 33 of the latch circuit 32 (FIG. 1) are connected to a first set of inputs 88 of a divider circuit 90 having a second set of inputs 92, to which are applied the value F over a bus 94.

The input signal line 84 is connected to the input of a delay line 96 which is identical in layout and construction to the delay line 14 included in the delay measuring circuit 10 (see FIG. 1). Thus, the delay line 96 includes N individual series-connected delay cells 98, identified as 98-1 to 98-N, respectively. The outputs of the delay cells 98-1 to 98-N are connected via respective lines 100-1 to 100-N to corresponding number inputs 1, 2, --, N of a switch 102.

The output lines 104 of the divider circuit 90 are connected to a first set of inputs of a subtractor circuit 106, which has a second set of inputs coupled to receive a correction value C (to be explained) from a register 108, which may be a storage location provided in a memory device (not shown) included in the chip 80.

The operation of the circuit 82 will now be described. Generally, the divider circuit 90 is effective to divide the number X, representing the number of delay cells 16 (FIG. 1) having a delay equal to the reference clock period T, by the number F, resulting in the number X/F (with the fractional part discarded), which number is used to control the number of effective delay cells 98 in the delay line 96, by appropriately controlling the switch 102, such that a number X/F of delay cells 98 are effectively connected between the input line 84 and the output line 86.

However, it is necessary to compensate for the intrinsic delay e of the switch 102. This intrinsic delay is compensated for computing the value e/D (with the fractional part discarded) as a correction value C=e/D, and storing such correction value C in the register 108. The subtractor 106 is then effective to provide on its output lines 110 the value $$X/F - e/D.$$

Thus the total delay between the lines 84 and 86 is
$(X/F - e/D) \cdot D + e \approx (X/F) \cdot D$ as desired. Note that the minimum selectable delay is determined by e/D, since X/F must be larger than e/D. The minimum selectable delay is e, for $F=(X \cdot D)/e$ the maximum selectable delay is T, for F=1. The term e/D is determined by the physical properties of the cells used in the chip 80. Since both the switch 102 and the delay cells 16 and 98 are on the same chip 80, the tracking between all cells is excellent. This implies that the term e/D (=C, stored in the register 108) is fixed and independent of temperature and supply voltage fluctuations. Clearly, in order to achieve the maximum possible accuracy in the delay between the input line 84 and the output line 86, the delay cells 98 should be constructed to provide a delay D which is as small as possible.

What is claimed is:

1. A delay measuring circuit, comprising:
   input means adapted to receive an applied clock signal;
   a switching device having an intrinsic delay and having a plurality of inputs and a plurality of control inputs;
   a delay line coupled to said input means, having a plurality of individual delay cells with outputs thereof respectively connected to certain of said inputs of said switching device;
   counter means having an input coupled to said input means and having output means coupled to certain of said plurality of control inputs of said switching device to thereby connect a selected input of said switching device to an output thereof;
   latch means coupled to said output means of said counter means for latching a count value in said counter means;
   a delay device having a delay substantially equal to the intrinsic delay of said switching device and being coupled to said input device; and
   phase comparator means having inputs coupled to an output of said switching device and to an output of said delay device, and having output means coupled to said counter means and to said latch means, whereby in response to a phase comparison match, a count value in said counter means is latched into said latch means and said counter means is reset to a predetermined value, such that said latch means stores a value dependent on the delay of one of the individual delay cells.

2. The delay measuring circuit of claim 1, in which said delay line includes N individual delay cells, and in which said counter means includes an A-bit binary counter having A output lines connected to said control inputs of said switching device.

3. The delay measuring circuit of claim 1, in which said applied clock signal has a period T, and in which said latch means is adapted to store a value X, where X equals T/D, D being the delay of any one of said delay cells.

4. A timing monitoring circuit, comprising:
   input means adapted to receive an applied clock signal;
   a switching device having an intrinsic delay and having a plurality of inputs and a plurality of control inputs;
   a delay line coupled to said input means, having a plurality of individual delay cells with outputs thereof respectively connected to certain of said inputs of said switching device;
   counter means having an input coupled to said input means and having output means coupled to certain of said plurality of control inputs of said switching device to thereby connect a selected input of said switching device to an output thereof;
   latch means coupled to said output means of said counter means for latching a count value in said counter means;
   a delay device having a delay substantially equal to the intrinsic delay of said switching device and being coupled to said input device;
   phase comparator means having inputs coupled to an output of said switching device and to an output of said delay device, and having output means coupled to said counter means and to said latch means, whereby in response to a phase comparison match, a count value in said counter means is latched into said latch means and said counter means is reset to a predetermined value, such that said latch means stores a value dependent on the delay of one of the individual delay cells;
   additional input means adapted to receive a predetermined maximum value; and
   comparator means having an output, a first input coupled to said output of said latch means and a second input coupled to said additional input means to receive said predetermined maximum value, whereby said comparator means provides an output signal in response to the value stored in said latch means exceeding said predetermined maximum value.

5. The timing monitoring circuit of claim 4, also including a latch device having a clocking input coupled to said input means and adapted to receive said applied clock signal, in which said comparator means has an output coupled to an input of said latch device.

6. A delay control circuit, comprising:

input means adapted to receive an applied clock signal;

a switching device having an intrinsic delay and having a plurality of inputs and a plurality of control inputs;

a delay line coupled to said input means, having a plurality of individual delay cells with outputs thereof respectively connected to certain of said inputs of said switching device;

counter means having an input coupled to said input means and having output means coupled to said latch means and to certain of said plurality of inputs of said switching device to thereby connect a selected input of said switching device to an output thereof;

latch means coupled to said output means of said counter means for latching a count value in said counter means;

a delay device having a delay substantially equal to the intrinsic delay of said switching device and being coupled to said input device;

phase comparator means having inputs coupled to an output of said switching device and to an output of said delay device, and having output means coupled to said counter means an to said latch means whereby in response to phase comparison match, a count value in said counter means is latched into said latch means and said counter means is reset to a predetermined value, such that said latch means stores a value dependent on the delay of one of the individual delay cells;

signal input means adapted to receive a signal to be delayed;

a further delay line coupled to said signal input means and having a plurality of individual delay cells;

signal output means; and selection means coupled to said latch means and to said further delay line, said selection means having an input and being adapted to select the output of one of said individual delay cells of said further delay line for connection to said signal output means, independence upon a control signal applied to said input of said selection means, whereby a signal applied to said signal input means is delayed by a fraction of the period of said applied clock signal, corresponding to said control signal, the delayed input signal being provided as an output signal on aid signal output means.

7. The delay control circuit of claim 6 in which said selection means includes divider means having a first input connected to an output of said latch means, a second input connected to receive said control signal and an output; compensation means having an input coupled to an output of said divider means, to adjust the output of the divider means by a compensating value, and an output means; and a further switching device having a plurality of control inputs coupled to the output means of the compensation means, also having inputs coupled to the respective outputs of the delay cells of said further delay line, and having an output connected to said signal output means.

8. The delay control circuit of claim 7, in which said compensation means includes a subtractor circuit adapted to subtract said compensating value from the value represented on said output of said divider means.

9. The delay control circuit of claim 8, in which said compensation means also includes storage means coupled to said subtractor circuit for storing said compensating value.

* * * * *

UNITED STATES PATENT AND TRADEMARK OFFICE
CERTIFICATE OF CORRECTION

PATENT NO.   : 5,049,766
DATED        : September 17, 1991
INVENTOR(S)  : Hans van Driest et al.

It is certified that error appears in the above-identified patent and that said Letters Patent is hereby corrected as shown below:

Column 8, line 13, delete "independence" and substitute --in dependence--.

Signed and Sealed this

Fifth Day of January, 1993

Attest:

DOUGLAS B. COMER

*Attesting Officer*      Acting Commissioner of Patents and Trademarks